United States Patent
Kimura et al.

(10) Patent No.: US 8,729,578 B2
(45) Date of Patent: May 20, 2014

(54) SEMICONDUCTOR LIGHT EMITTING DEVICE AND METHOD FOR MANUFACTURING THE SAME

(71) Applicant: Kabushiki Kaisha Toshiba, Tokyo (JP)

(72) Inventors: Shigeya Kimura, Kanagawa-ken (JP); Hajime Nago, Kanagawa-ken (JP); Koichi Tachibana, Ishikawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/803,563

(22) Filed: Mar. 14, 2013

(65) Prior Publication Data

US 2014/0034978 A1 Feb. 6, 2014

(30) Foreign Application Priority Data

Aug. 1, 2012 (JP) .................. 2012-171527

(51) Int. Cl.
*H01L 33/08* (2010.01)

(52) U.S. Cl.
USPC ........... 257/94; 438/22; 438/46; 257/E33.025

(58) Field of Classification Search
USPC ....... 257/94, 96, 97, E33.025; 438/22, 46, 47
See application file for complete search history.

(56) References Cited

U.S. PATENT DOCUMENTS

| | | | |
|---|---|---|---|
| 5,488,233 A | * | 1/1996 | Ishikawa et al. ................ 257/94 |
| 5,515,393 A | * | 5/1996 | Okuyama et al. .......... 372/45.01 |
| 5,777,350 A | * | 7/1998 | Nakamura et al. .............. 257/96 |
| 2003/0006418 A1 | | 1/2003 | Emerson et al. |
| 2005/0045895 A1 | | 3/2005 | Emerson et al. |
| 2007/0158637 A1 | | 7/2007 | Tanaka |
| 2008/0038858 A1 | | 2/2008 | Emerson et al. |
| 2010/0133508 A1 | | 6/2010 | Bergmann et al. |

(Continued)

FOREIGN PATENT DOCUMENTS

| | | |
|---|---|---|
| EP | 2 365 540 A2 | 9/2011 |
| EP | 2 365 540 A3 | 9/2011 |

(Continued)

OTHER PUBLICATIONS

The Extended European Search Report issued Nov. 5, 2013, in Application No. / Patent No. 13175800.5-1551.

(Continued)

*Primary Examiner* — Roy Potter
(74) *Attorney, Agent, or Firm* — Oblon, Spivak, McClelland, Maier & Neustadt, L.L.P.

(57) ABSTRACT

According to one embodiment, a semiconductor light emitting device includes a first semiconductor layer, a second semiconductor layer and a light emitting layer. The second semiconductor layer is provided on a [0001]-direction side of the first semiconductor layer. The light emitting layer includes a first well layer, a second well layer and a first barrier layer. An In composition ratio of the barrier layer is lower than that of the first well layer and the second well layer. The barrier layer includes a first portion and a second portion. The second portion has a first region and a second region. The first region has a first In composition ratio higher than that of the first portion. The second region is provided between the first region and the first well layer. The second region has a second In composition ratio lower than the first In composition ratio.

20 Claims, 13 Drawing Sheets

(56) References Cited

U.S. PATENT DOCUMENTS

| | | |
|---|---|---|
| 2011/0215351 A1 | 9/2011 | Kimura et al. |
| 2012/0007113 A1 | 1/2012 | Hwang et al. |
| 2012/0018701 A1 | 1/2012 | Bergmann et al. |
| 2012/0298955 A1 | 11/2012 | Emerson et al. |
| 2013/0087761 A1 | 4/2013 | Kimura et al. |
| 2013/0200390 A1 | 8/2013 | Kimura et al. |

FOREIGN PATENT DOCUMENTS

| | | |
|---|---|---|
| JP | 11-8406 | 1/1999 |
| JP | 2007-116147 | 5/2007 |
| JP | 2010-155591 | 7/2010 |
| JP | 2011-54982 | 3/2011 |
| JP | 2012-60170 | 3/2012 |
| WO | WO 02/097904 A2 | 12/2002 |
| WO | WO 02/097904 A3 | 12/2002 |
| WO | WO 2011/021264 A1 | 2/2011 |

OTHER PUBLICATIONS

Office Action issued on Apr. 25, 2013 in the counterpart Japanese Patent Application No. 2012-171527 (with English Translation).

* cited by examiner

SEMICONDUCTOR LIGHT EMITTING DEVICE AND METHOD FOR MANUFACTURING THE SAME

CROSS-REFERENCE TO RELATED APPLICATIONS

This application is based upon and claims the benefit of priority from the prior Japanese Patent Application No. 2012-171527, filed on Aug. 1, 2012; the entire contents of which are incorporated herein by reference.

FIELD

Embodiments described herein relate generally to a semiconductor light emitting device and a method for manufacturing the same.

BACKGROUND

Nitride-based group III-V compound semiconductors such as gallium nitride (GaN), etc., are applied to light emitting diodes (LEDs), laser diodes (LDs), etc., that have high luminance by leveraging a wide bandgap. It is desirable for such semiconductor light emitting devices to realize high luminous efficiency.

DETAILED DESCRIPTION

Figure 1:
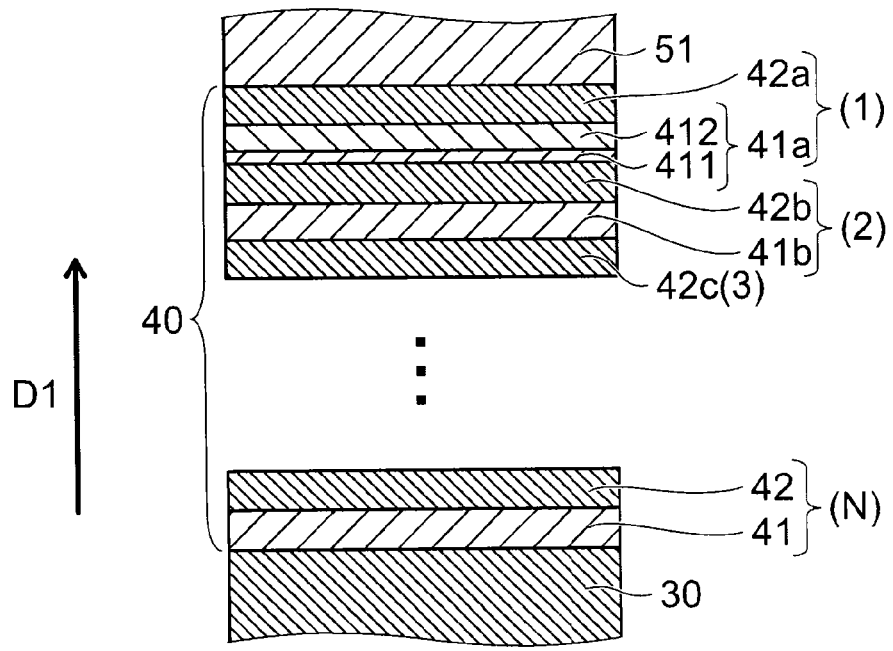
FIG. 1 is a schematic cross-sectional view showing a portion of a semiconductor light emitting device according to a first embodiment.

In general, according to one embodiment, a semiconductor light emitting device includes a first semiconductor layer of a first conductivity type, a second semiconductor layer of a second conductivity type and a light emitting layer. The first semiconductor layer includes a nitride semiconductor. The second semiconductor layer is provided on a [0001]-direction side of the first semiconductor layer. The second semiconductor layer includes the nitride semiconductor. The light emitting layer is provided between the first semiconductor layer and the second semiconductor layer. The light emitting layer includes the nitride semiconductor. The light emitting layer includes a first well layer, a second well layer and a first barrier layer. The first well layer is provided between the first semiconductor layer and the second semiconductor layer. The second well layer is provided between the first well layer and the first semiconductor layer. The first barrier layer is provided between the second well layer and the first well layer. The first barrier layer contacts the second well layer and the first well layer. An In composition ratio of the first barrier layer is lower than an In composition ratio of the first well layer and an In composition ratio of the second well layer. The first barrier layer includes a first portion and a second portion. The first portion is provided between the first well layer and the second well layer. The first portion contacts the second well layer. The first portion has a first thickness in a first direction from the first semiconductor layer toward the second semiconductor layer. The second portion is provided between the first portion and the first well layer. The second portion has a first region and a second region. The first region contacts the first portion. The second region is provided between the first region and the first well layer. The second region contacts the first well layer. The first region has a first In composition ratio higher than an In composition ratio of the first portion. The second region has a second In composition ratio lower than the first In composition ratio.

Various embodiments will be described hereinafter with reference to the accompanying drawings.

The drawings are schematic or conceptual; and the relationships between the thicknesses and the widths of portions, the proportional coefficients of sizes between portions, etc., are not necessarily the same as the actual values thereof. Further, the dimensions and/or the proportional coefficients may be illustrated differently between the drawings, even for identical portions.

In the drawings and the specification of the application, components similar to those described in regard to a drawing thereinabove are marked with like reference numerals, and a detailed description is omitted as appropriate.

First Embodiment

FIG. 1 is a schematic cross-sectional view showing a portion of a semiconductor light emitting device according to a first embodiment.

Figure 2:
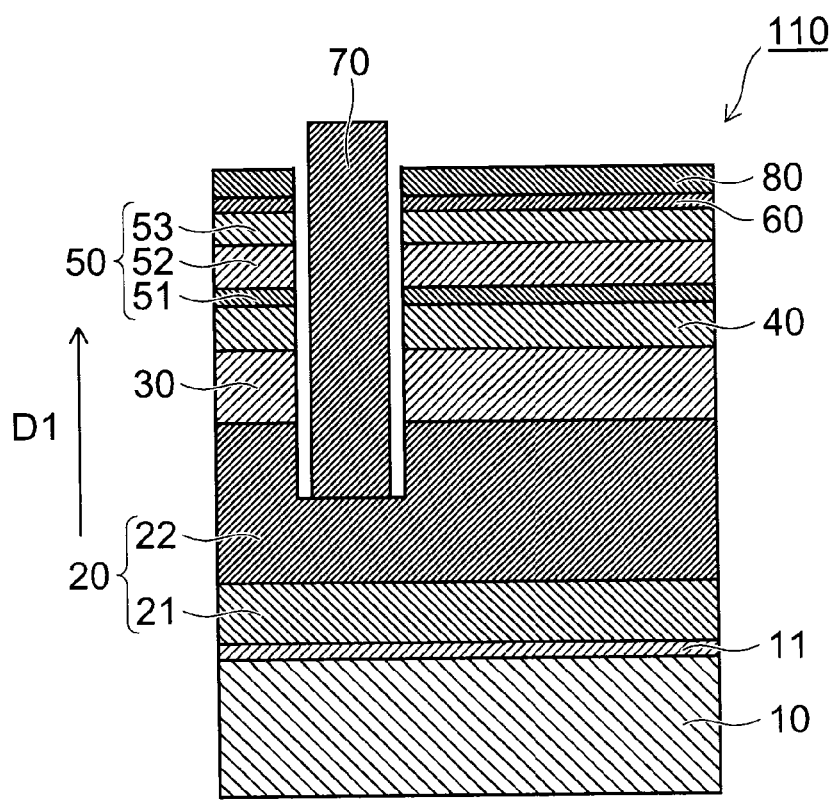
FIG. 2 is a schematic cross-sectional view showing the semiconductor light emitting device according to the first embodiment.

FIG. 2 is a schematic cross-sectional view showing the configuration of the semiconductor light emitting device according to the first embodiment.

As shown in FIG. 2, the semiconductor light emitting device 110 according to the first embodiment includes a first semiconductor layer 20 of a first conductivity type, a second semiconductor layer 50 of a second conductivity type, and a light emitting layer 40.

The first conductivity type is, for example, an n type. The second conductivity type is, for example, a p type. The first conductivity type may be the p type; and the second conductivity type may be the n type. The case where the first conductivity type is the n type and the second conductivity type is the p type is described as an example in the embodiment.

The first semiconductor layer 20, the second semiconductor layer 50, and the light emitting layer 40 include a nitride semiconductor. The second semiconductor layer 50 is provided on a [0001]-direction side of the first semiconductor layer 20. The light emitting layer 40 is provided between the first semiconductor layer 20 and the second semiconductor layer 50. In the semiconductor light emitting device 110, a stacked body 30 may be provided between the light emitting layer 40 and the first semiconductor layer 20.

Herein, a direction from the first semiconductor layer 20 toward the second semiconductor layer 50 is taken as a D1 direction. The second semiconductor layer 50 is disposed on the D1-direction side of the first semiconductor layer 20.

In the semiconductor light emitting device 110, a substrate 10 is, for example, a sapphire substrate of the (0001) plane (the c-plane). The c-plane is a so-called polar plane. For example, a buffer layer 11 is provided on a major surface of the substrate 10. The first semiconductor layer 20 is provided on the buffer layer 11.

The surface of the first semiconductor layer 20 on the D1-direction side is the (0001) plane. However, the surface of the first semiconductor layer 20 on the D1-direction side may be a surface tilted from the (0001) plane. In the case where the offset angle tilted from the (0001) plane is less than 40 degrees and not less than 0 degrees, the piezoelectric polarization that occurs is the same as that of the case where the surface of the first semiconductor layer 20 on the D1-direction side is the (0001) plane. On the other hand, in the case where the angle tilted from the (0001) plane is 40 degrees or more, the direction of the piezoelectric polarization is the reverse of the polarization recited above. Accordingly, in the first embodiment, it is favorable for the offset angle tilted from the (0001) plane to be, for example, less than 40 degrees and not less than 0 degrees.

The state recited above in which the second semiconductor layer 50 is provided on the [0001]-direction side of the first semiconductor layer 20 includes the case where the second semiconductor layer 50 is provided in a direction that is tilted from the (0001) plane of the first semiconductor layer 20 as recited above. The D1-direction surface of the first semiconductor layer 20 is a Ga surface.

The first semiconductor layer 20 includes, for example, an undoped GaN foundation layer 21 and an n-type GaN contact layer 22.

The stacked body 30 is provided on the n-type GaN contact layer 22. The stacked body 30 is, for example, a superlattice layer. In the stacked body 30, for example, a first crystal layer and a second crystal layer are alternately stacked.

The light emitting layer 40 which is an active layer is provided on the stacked body 30. The light emitting layer 40 has, for example, a multiple quantum well (MQW) structure. In other words, the light emitting layer 40 has a structure in which multiple barrier layers 41 and multiple well layers 42 are repeatedly stacked alternately. Detailed configurations of the barrier layer 41 and the well layer 42 are described below.

The second semiconductor layer 50 is provided on the D1-direction side of the light emitting layer 40. The second semiconductor layer 50 includes, for example, an intermediate layer 51, a magnesium (Mg) doped GaN layer 52, and a p-type GaN contact layer 53. For example, the intermediate layer 51, the Mg doped GaN layer 52, and the p-type GaN layer 53 are provided in this order on the light emitting layer 40.

The intermediate layer 51 is provided on the side of the second semiconductor layer 50 most proximal to the light emitting layer 40 and includes a nitride semiconductor including aluminum (Al). Specifically, the intermediate layer 51 is a p-type AlGaN layer. The bandgap of the intermediate layer 51 is larger than the bandgap of the light emitting layer 40. Thereby, the intermediate layer 51 functions as an electron overflow suppression layer.

A transparent electrode 60 is provided on the p-type GaN contact layer 53.

A portion of the n-type GaN contact layer 22 which is the first semiconductor layer 20 is removed with the stacked body 30, the light emitting layer 40, and the second semiconductor layer 50 that correspond to the portion of the n-type GaN contact layer 22; and an n-side electrode 70 is provided on the n-type GaN contact layer 22. The n-side electrode 70 may include, for example, a Ti/Pt/Au stacked structure. On the other hand, a p-side electrode 80 is provided on the transparent electrode 60.

Thus, the semiconductor light emitting device 110 of this specific example according to the embodiment is a light emitting diode (LED).

The multiple quantum well structure of the light emitting layer 40 will now be described.

As shown in FIG. 1, the light emitting layer 40 includes a first well layer 42a, a first barrier layer 41a, and a second well layer 42b.

The first well layer 42a is provided between the first semiconductor layer 20 and the second semiconductor layer 50. The second well layer 42b is provided between the first well layer 42a and the first semiconductor layer 20. The first barrier layer 41a is provided between the second well layer 42b and the first well layer 42a to contact the second well layer 42b and the first well layer 42a. The In composition ratio of the first barrier layer 41a is lower than the In composition ratio of the first well layer 42a and the In composition ratio of the second well layer 42b.

Herein, the In composition ratio refers to the proportion of indium (In) in the elemental components inside the film.

In the embodiment, for example, the light emitting layer 40 includes multiple well layers 42 and multiple barrier layers 41. In such a case, the number of the well layers 42 is taken as a well layer number N (N being an integer not less than 2).

In FIG. 1, the numerals inside the parentheses indicate the order of the well layer from the second semiconductor layer 50 side. These well layers are the first well layer 42a to the Nth well layer 42 from the second semiconductor layer 50 side. Also, N layers of the barrier layer 41 are provided. Similarly, these barrier layers are the first barrier layer 41a to the Nth barrier layer 41 from the second semiconductor layer 50 side.

Among the well layers, the first well layer 42a is, for example, the well layer 42 positioned on the side of the light emitting layer 40 most proximal to the second semiconductor layer 50. The first barrier layer 41a is, for example, the barrier layer 41 positioned on the side of the light emitting layer 40 most proximal to the second semiconductor layer 50.

The light emitting layer 40 may further include, for example, a second barrier layer 41b and a third well layer 42c. The second barrier layer 41b is provided between the first semiconductor layer 20 and the second well layer 42b to contact the second well layer 42b. The In composition ratio of the second barrier layer 41b is lower than the In composition ratio of the second well layer 42b.

The third well layer 42c is provided between the first semiconductor layer 20 and the second barrier layer 41b to contact the second barrier layer 41b. The In composition ratio of the third well layer 42c is higher than the second barrier layer 41b.

The Nth well layer 42 is provided between the (N−1)th barrier layer 41 and the first semiconductor layer 20 to contact the (N−1)th barrier layer 41. The In composition ratio of the Nth well layer 42 is higher than that of the (N−1)th barrier layer 41.

The Nth barrier layer 41 is provided between the Nth well layer 42 and the first semiconductor layer 20 to contact the Nth well layer 42. The In composition ratio of the Nth barrier layer 41 is lower than the In composition ratio of the Nth well layer 42.

Herein, the first well layer 42a to the Nth well layer are generally referred to as the well layer 42. The first barrier layer 41a to the Nth barrier layer are generally referred to as the barrier layer 41.

The barrier layer 41 and the well layer 42 of the light emitting layer 40 include a group III element. At least the well layer 42 includes a nitride semiconductor including, for example, In. The crystal structure of the light emitting layer 40 is a wurtzite structure. The bandgap energy of the barrier layer 41 is larger than the bandgap energy of the well layer 42. The barrier layer 41 and the well layer 42 may include a trace of Al, etc.

For example, the barrier layer 41 includes $In_bGa_{1-b}N$ (b≥0). The well layer 42 includes $In_wGa_{1-w}N$ (0<w<1). Because the In composition ratio of the barrier layer 41 is lower than the In composition ratio of the well layer 42, it follows that b<w.

Details of the light emitting layer 40 will now be described using FIG. 3.

Figure 3:
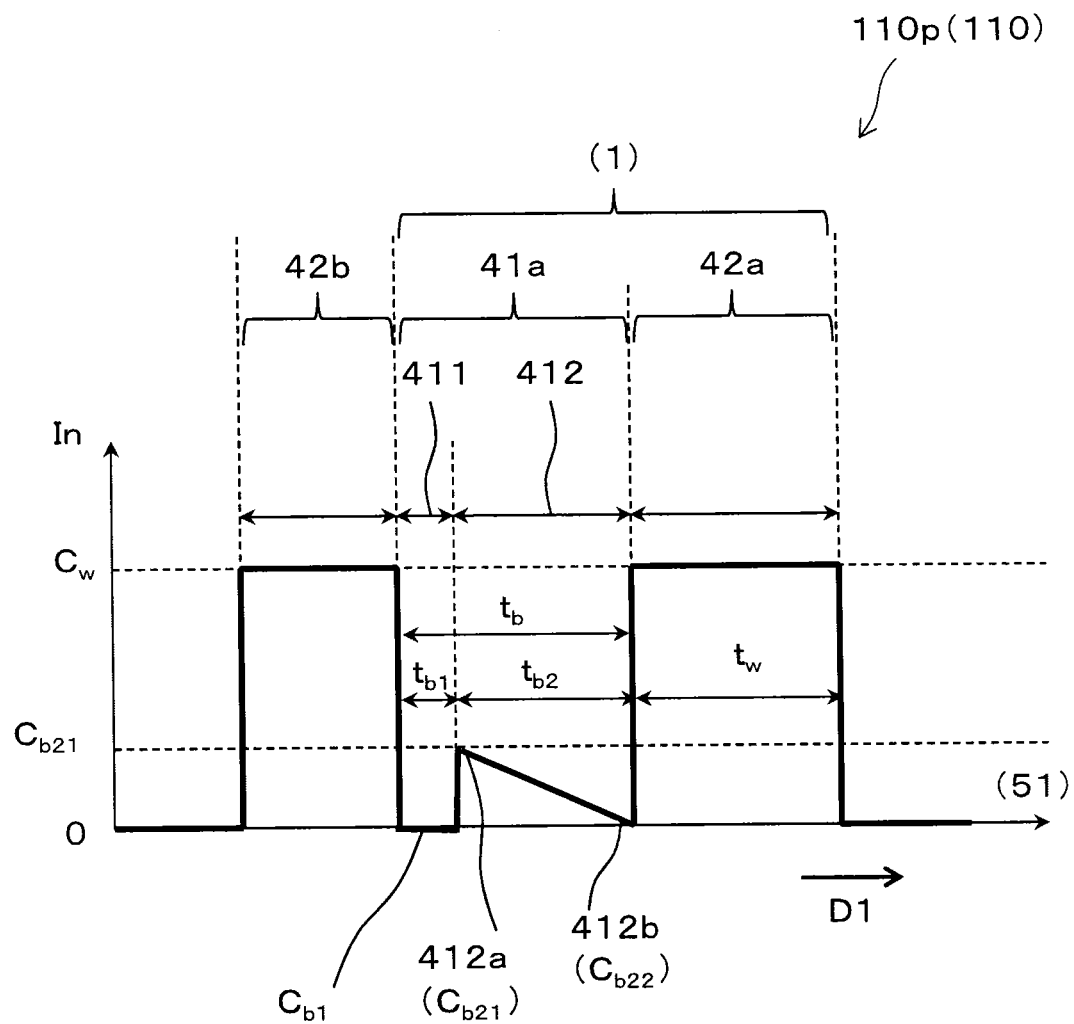
FIG. 3 shows the profile of the In composition ratio according to the first embodiment.

FIG. 3 shows the profile of the In composition ratio according to the first embodiment.

In FIG. 3, the horizontal axis is the D1-direction position (the thickness-direction position); and the vertical axis is the In composition ratio. A profile 110p is the profile of the In composition ratio according to the first embodiment.

As shown in FIG. 3, the In composition ratios of the first well layer 42a and the second well layer 42b are, for example, $C_w$. The In composition ratio of the first barrier layer 41a ($C_{b21}$ and $C_{b22}$) is lower than the In composition ratio $C_w$ of the first well layer 42a and the second well layer 42b.

Here, the first barrier layer 41a includes a first portion 411 and a second portion 412.

The first portion 411 is provided between the first well layer 42a and the second well layer 42b to contact the second well layer 42b. The In composition ratio of the first portion 411 is $C_{b1}$. The In composition ratio $C_{b1}$ of the first portion 411 is lower than the In composition ratio $C_w$ of the second well layer 42b and is lower than a first In composition ratio $C_{b21}$ of a first region 412a of the second portion 412 described below. The In composition ratio $C_{b1}$ of the first portion 411 is equal to or lower than a second In composition ratio $C_{b22}$ of a second region 412b of the second portion 412 described below. Thus, because the first portion 411 which has the low In composition ratio is provided between the first well layer 42a and the second well layer 42b, the crystallinity improves for the layers stacked further in the D1 direction than the first portion 411. The crystallinity of at least the first well layer 42a improves.

The second portion 412 has the first region 412a and the second region 412b.

The first region 412a contacts the first portion 411 and has the first In composition ratio $C_{b21}$ that is higher than the In composition ratio $C_{b1}$ of the first portion 411.

The first region 412a refers to, for example, the region of the second portion 412 on the first portion 411 side of the D1-direction center. The first In composition ratio $C_{b21}$ is, for example, a maximum value of the In composition ratio of the first region 412a. The first In composition ratio $C_{b21}$ may be, for example, the value of the In composition ratio of the first region 412a averaged over the thickness.

The second region 412b refers to, for example, the region of the second portion 412 on the first well layer 42a side of the D1-direction center. The second region 412b is provided between the first region 412a and the first well layer 42a to contact the first well layer 42a. The second region 412b has the second In composition ratio $C_{b22}$ that is lower than the first In composition ratio $C_{b21}$ of the first region 412a.

The second In composition ratio $C_{b22}$ is, for example, a minimum value of the In composition ratio of the second region 412b. In this example, the second In composition ratio $C_{b22}$ of the second region 412b is equal to the In composition ratio $C_{b1}$ of the first portion 411. The second In composition ratio $C_{b22}$ may be, for example, the value of the In composition ratio of the second region 412b averaged over the thickness.

Thus, the In composition ratio of the second portion 412 gradually decreases in the D1 direction. In other words, the In composition ratio of the second portion 412 monotonously decreases in the D1 direction. Thereby, the curve of the valence band of the first barrier layer 41a due to the piezoelectric field is relaxed. The hole injection efficiency from the second semiconductor layer 50 side toward the first barrier layer 41a increases.

A thickness $t_b$ of the barrier layer 41 is, for example, not more than 10 nanometers (nm). Thereby, holes are supplied efficiently into the light emitting layer 40 from the second semiconductor layer 50. The luminous efficiency of the semiconductor light emitting device 110 increases; and the operating voltage is reduced to a practically desirable level.

The details of the thickness and the In composition ratio of each of the portions of the barrier layer 41 are described below.

The thickness $t_w$ of the well layer 42 (the first well layer 42a and the second well layer 42b) is, for example, not less than 2.5 nm, and more favorably not less than 4 nm. Thereby, the carriers are trapped in the well layer 42; and the luminous efficiency increases. It is favorable for the thickness $t_w$ of the well layer 42 to be, for example, not more than 6 nm. Thereby, the degradation of the crystallinity due to the well layer 42 having a high In composition ratio can be suppressed.

The thickness of the first well layer 42a that is positioned on the side most proximal to the second semiconductor layer 50 may be thicker than the other well layers 42. By the thickness of the first well layer 42a being thick, the volume of this portion increases. Thereby, the luminous efficiency increases due to the decrease of the carrier density even in the case where the semiconductor light emitting device 110 is driven in a high current region.

The In composition ratio $C_w$ of the well layer 42 is adjusted to match the light emission wavelength of the semiconductor light emitting device 110. In the case where the emitted light is blue, the In composition ratio $C_w$ of the well layer 42 is, for example, less than 0.15 and not less than 0.12.

The thickness and the In composition ratio will now be described for the first portion 411 and the second portion 412.

Figure 4A:
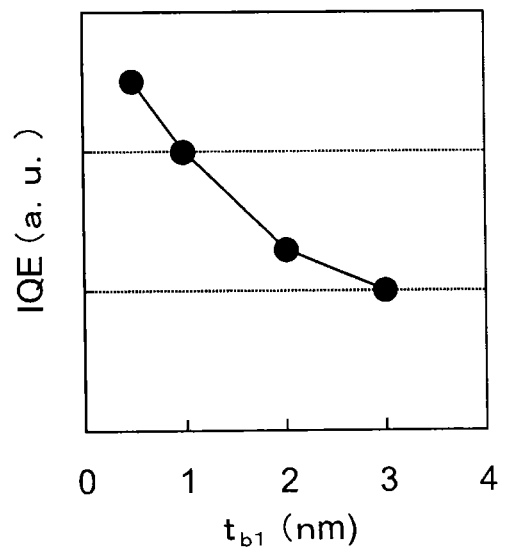
FIGS. 4A and 4B are graphs showing characteristics of the semiconductor light emitting device according to the first embodiment.
Figure 4B:
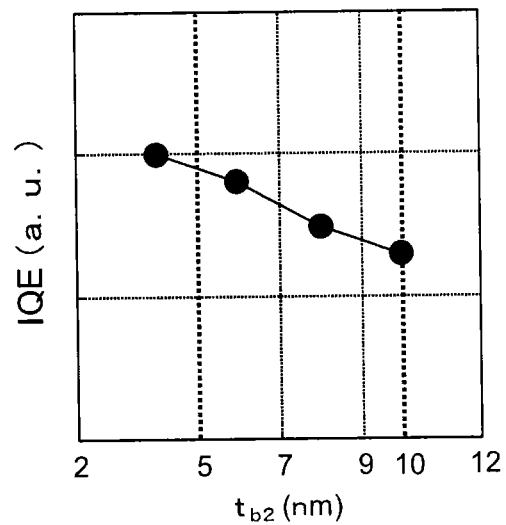

FIGS. 4A and 4B are graphs showing characteristics of the semiconductor light emitting device according to the first embodiment.

FIG. 4A shows results of a simulation of an internal quantum efficiency IQE of the semiconductor light emitting device 110 with respect to a thickness $t_{b1}$ of the first portion 411.

FIG. 4B shows results of a simulation of the internal quantum efficiency IQE of the semiconductor light emitting device 110 with respect to a thickness $t_{b2}$ of the second portion 412.

The vertical axis has arbitrary units.

First, the first portion 411 will be described.

As described above, the first portion 411 of the first barrier layer 41 is interposed between the second well layer 42b and the second portion 412. In other words, the thickness of the first portion 411 is thicker than 0 nm. The crystallinity improves for the layers stacked further in the D1 direction than the first portion 411 as the thickness of the first portion 411 increases.

On the other hand, as shown in FIG. 4A, the internal quantum efficiency IQE has a tendency to decrease as the thickness of the first portion 411 increases. The first portion 411 is more of a barrier to the holes as the thickness of the first portion 411 increases. Therefore, the internal quantum efficiency IQE decreases because the hole injection efficiency decreases.

From the two aspects recited above, it is favorable for the thickness of the first portion 411 to be thicker than 0 nm and thinner than 2 nm. By the thickness of the first portion 411 being greater than 0 nm, the crystallinity improves for the layers stacked further in the D1 direction than the first portion 411. On the other hand, by the thickness of the first portion 411 being thinner than 2 nm, the holes pass through the first portion 411 due to tunneling. Accordingly, the internal quantum efficiency IQE of the semiconductor light emitting device 110 increases.

As shown in FIG. 4A, it is favorable for the thickness of the first portion 411 to be not more than 1 nm. Thereby, the tunneling probability of the holes increases; and the internal quantum efficiency IQE increases.

As shown in FIG. 3, the first portion 411 is provided in contact with the second well layer 42b. In the case where the In composition ratio of the first portion 411 is high, there is a possibility that the crystallinity may degrade.

For example, it is favorable for the In composition ratio $C_{b1}$ of the first portion 411 to be lower than 0.02. It is more favorable for the In composition ratio $C_{b1}$ of the first portion 411 to be lower than 0.01. Thereby, the crystallinity improves for the layers stacked further in the D1 direction than the first portion 411.

For example, the minimum value of the In composition ratio of the first portion 411 is not more than 0.02. In other words, the first portion 411 has a portion made of only GaN. A layer not including In is formed in the first portion 411. For example, the entire first portion 411 may be made of substantially GaN. Thereby, the crystallinity markedly improves.

The first portion 411 may include Al. It is favorable for the minimum value of the Al composition ratio of the first portion 411 to be not more than 0.02. This is because there is a possibility that the first portion 411 may undesirably be a barrier to the holes in the case where the first portion 411 includes Al and the bandgap of the first portion 411 is large.

The second portion 412 will now be described.

The thickness $t_{b2}$ of the second portion 412 is not less than 2 nm, and more favorably not less than 4 nm. As recited above, the carriers pass through the first portion 411 due to the tunneling. By the thickness $t_{b2}$ of the second portion 412 being not less than the lower limit recited above, the second portion 412 substantially functions as the barrier layer of the MQW.

On the other hand, as shown in FIG. 4B, the internal quantum efficiency IQE has a tendency to decrease as the thickness of the second portion 412 increases.

The thickness $t_{b2}$ of the second portion 412 is not more than 9 nm, and more favorably not more than 7 nm. Thereby, the internal quantum efficiency IQE increases.

As shown in FIG. 3, the first In composition ratio $C_{b21}$ of the first region 412a of the second portion 412 is higher than the In composition ratio $C_{b1}$ of the first portion 411. The hole injection efficiency has a tendency to increase as the first In composition ratio $C_{b21}$ of the first region 412a increases. On the other hand, the crystallinity of the first well layer 42a has a tendency to degrade as the first In composition ratio $C_{b21}$ of the first region 412a increases.

The first In composition ratio $C_{b21}$ of the first region 412a of the second portion 412 is higher than 0.02, and more favorably not less than 0.04. The hole injection efficiency increases by the first In composition ratio $C_{b21}$ of the first region 412a being not less than the lower limit recited above.

The first In composition ratio $C_{b21}$ of the first region 412a is not more than 0.08, and more favorably not more than 0.06. By the first In composition ratio $C_{b21}$ of the first region 412a being not more than the upper limit recited above, the degradation of the crystallinity of the first well layer 42a is suppressed.

The second In composition ratio $C_{b22}$ of the second region 412b is not more than 0.04, and more favorably not more than 0.02. In the case where the second In composition ratio $C_{b22}$ of the second region 412b has a minimum value inside this region, it is favorable for the second In composition ratio $C_{b22}$ to be 0.00. Thus, from the aspect of the crystallinity, it is favorable for the second In composition ratio $C_{b22}$ of the second region 412b to be as low as possible.

The difference ($C_{b21}-C_{b22}$) between the first In composition ratio $C_{b21}$ of the first region 412a and the second In composition ratio $C_{b22}$ of the second region 412b is not less than 0.02, and more favorably not less than 0.04. Thereby, the curve of the valence band due to the piezoelectric field is relaxed.

The energy band diagram of the semiconductor light emitting device 110 according to the first embodiment and the characteristics of the semiconductor light emitting device 110 will now be described in comparison to two reference examples.

Figure 5A:
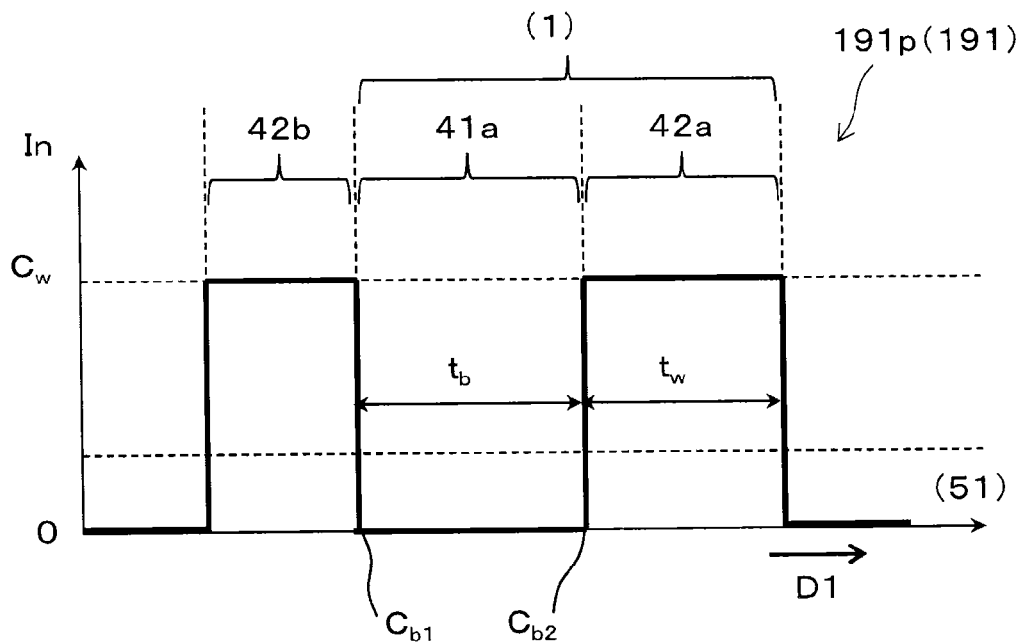
FIGS. 5A and 5B show profiles of In composition ratios according to the reference examples.
Figure 5B:
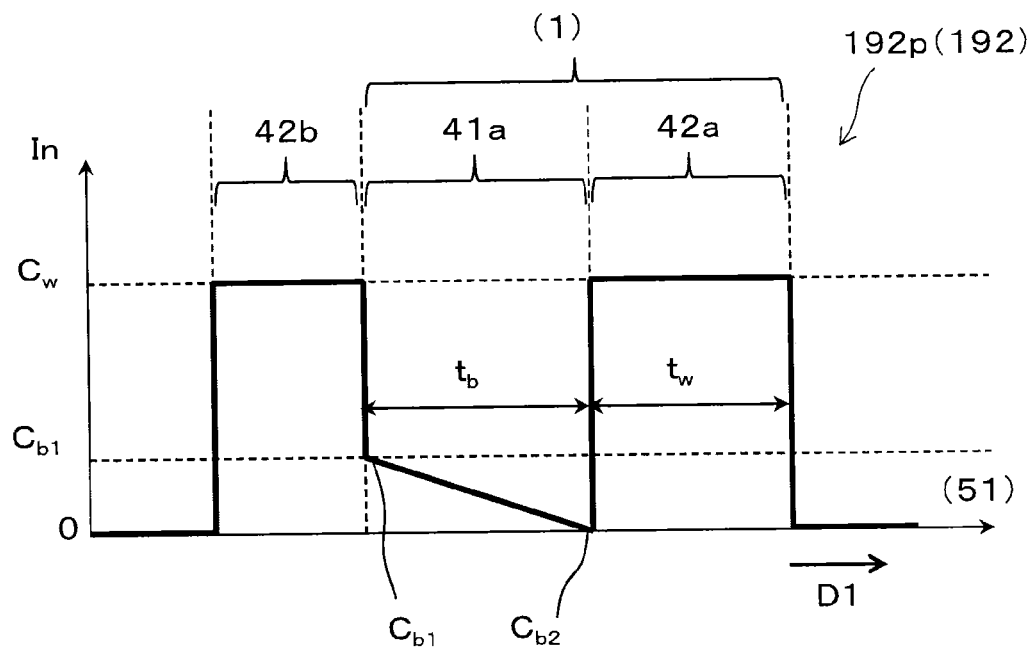

FIGS. 5A and 5B show profiles of In composition ratios according to the reference examples.

A profile 191p of the In composition ratio of the semiconductor light emitting device 191 according to the first reference example is shown in FIG. 5A.

As shown in FIG. 5A, the semiconductor light emitting device 191 of the first reference example differs from the semiconductor light emitting device 110 of the first embodiment in that the In composition ratio of the entire first barrier layer 41a is a constant value (e.g., 0). In other words, the first barrier layer 41a of the semiconductor light emitting device 191 of the first reference example does not include the second portion 412 that has the graded composition.

A profile 192p of the In composition ratio of the semiconductor light emitting device 192 according to the second reference example is shown in FIG. 5B.

As shown in FIG. 5B, the semiconductor light emitting device 192 of the second reference example differs from the semiconductor light emitting device 110 of the first embodiment in that the first barrier layer 41a does not include the first portion 411. In the second reference example, the In composition ratio $C_{b1}$ on the second well layer 42b side of the first barrier layer 41a is higher than an In composition ratio $C_{b2}$ on the first well layer 42a side of the first barrier layer 41a.

Similarly to the In composition ratio of the second portion 412 of the first embodiment, the In composition ratio of the first barrier layer 41a gradually decreases in the D1 direction.

The energy band diagram of the first embodiment and the energy band diagrams of the two reference examples will now be described using FIG. 6A and FIG. 8B.

The energy band diagrams of the following figures are results of simulations performed with the following assumptions.

In the first reference example, the first barrier layer 41a is made of GaN; and the thickness of the first barrier layer 41a is 5 nm.

In the second reference example, the In composition ratio $C_{b1}$ on the second well layer 42b side of the first barrier layer 41a is 0.04; and the In composition ratio $C_{b2}$ on the first well layer 42a side of the first barrier layer 41a is 0.00.

In the first embodiment, the thickness $t_{b1}$ of the first portion 411 is 1 nm. The first In composition ratio $C_{b21}$ is 0.04; and the second In composition ratio $C_{b22}$ is 0.00.

Figure 6A:
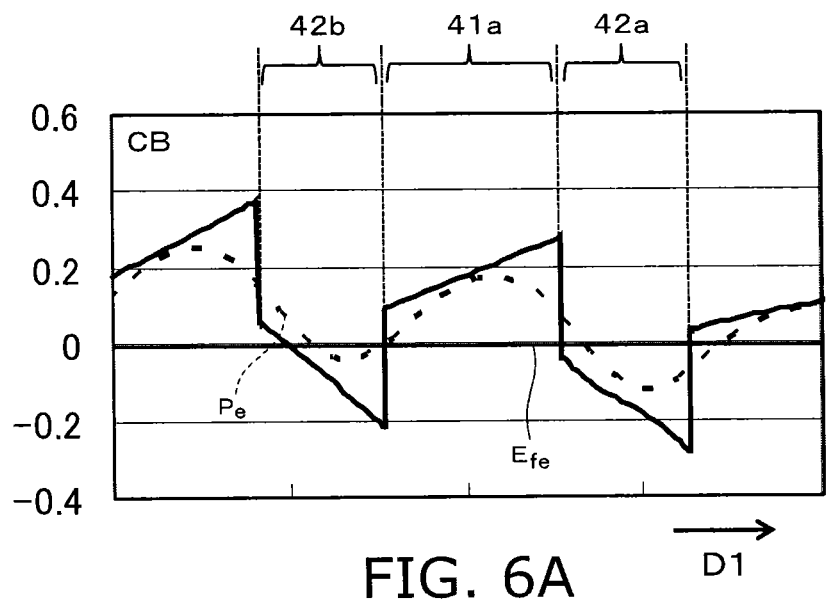
FIGS. 6A and 6B are energy band diagrams according to the first reference example.
Figure 6B:
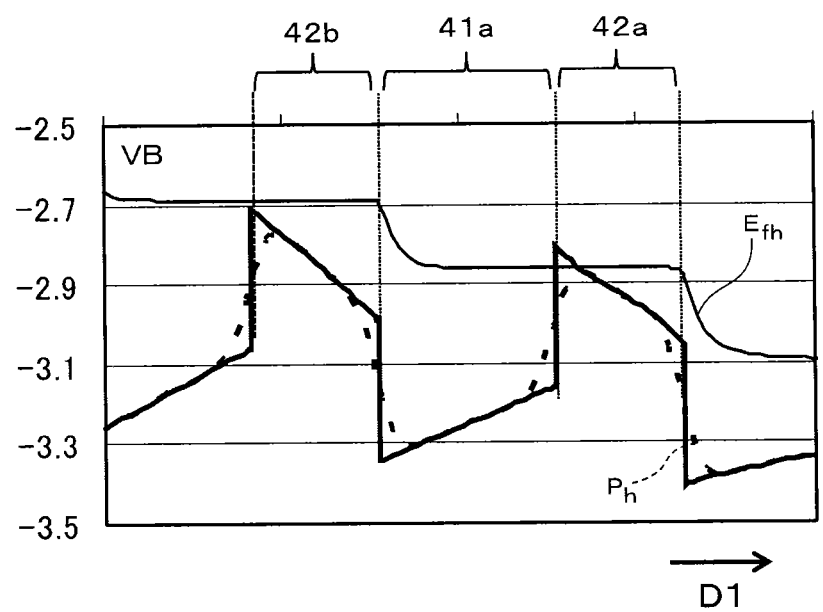

FIGS. 6A and 6B are energy band diagrams according to the first reference example.

FIG. 6A is an energy band diagram of a conduction band CB; and FIG. 6B is an energy band diagram of a valence band VB.

In FIG. 6A, the solid line is the energy band of the conduction band CB; the dotted line is a quantum potential $P_e$ of the electrons; and the broken line is a quasi Fermi level $E_{fe}$ of the electrons.

In FIG. 6B, the solid line is the energy band of the valence band VB; the dotted line is a quantum potential $P_h$ of the holes; and the broken line is a quasi Fermi level $E_{fh}$ of the holes.

The horizontal axis is the D1-direction position (the thickness-direction position).

As shown in FIGS. 6A and 6B, the band structure of the light emitting layer 40 is modulated by the piezoelectric field. In the first barrier layer 41a, the energy level of the conduction band CB increases in the direction (the D1 direction) from the first semiconductor layer 20 toward the second semiconductor layer 50. Conversely, in the first well layer 42a, the energy level of the conduction band CB decreases in the D1 direction. Similarly to the conduction band CB, the energy level of the valence band VB also has a curved profile.

The lattice constant of the crystal of the well layer 42 is larger than the lattice constant of the crystal of the barrier layer 41. Lattice strain occurs between the well layer 42 and the barrier layer 41. While tensile stress is applied to the barrier layer 41, compressive stress is applied to the well layer 42 which has a lattice constant greater than that of the barrier layer 41. Therefore, piezoelectric fields occur in these layers. In the well layer 42, the piezoelectric field is formed in a direction that is the reverse of that of the piezoelectric field of the barrier layer 41. As in the first reference example, the band structure of the light emitting layer 40 is modulated by the piezoelectric field. In the first reference example, there is a possibility that the luminous efficiency may decrease due to the modulation of the band structure of the light emitting layer 40.

Figure 7A:
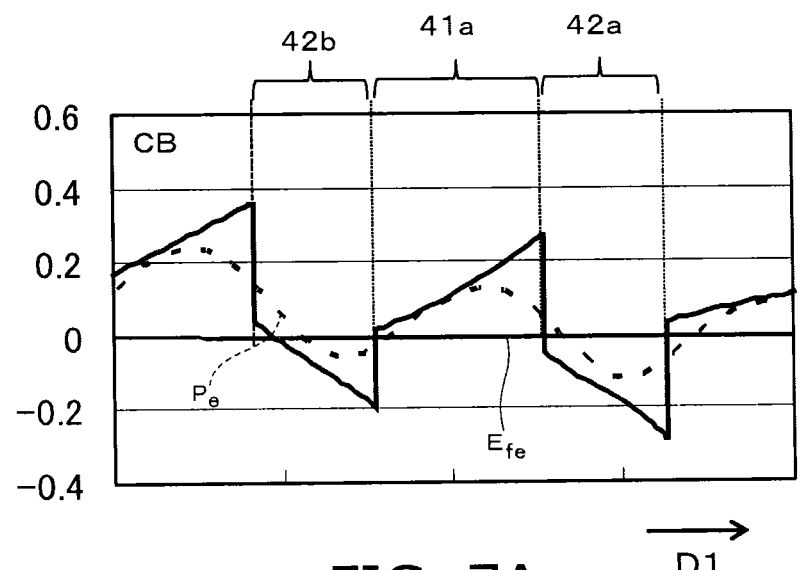
FIGS. 7A and 7B are energy band diagrams according to the second reference example.
Figure 7B:
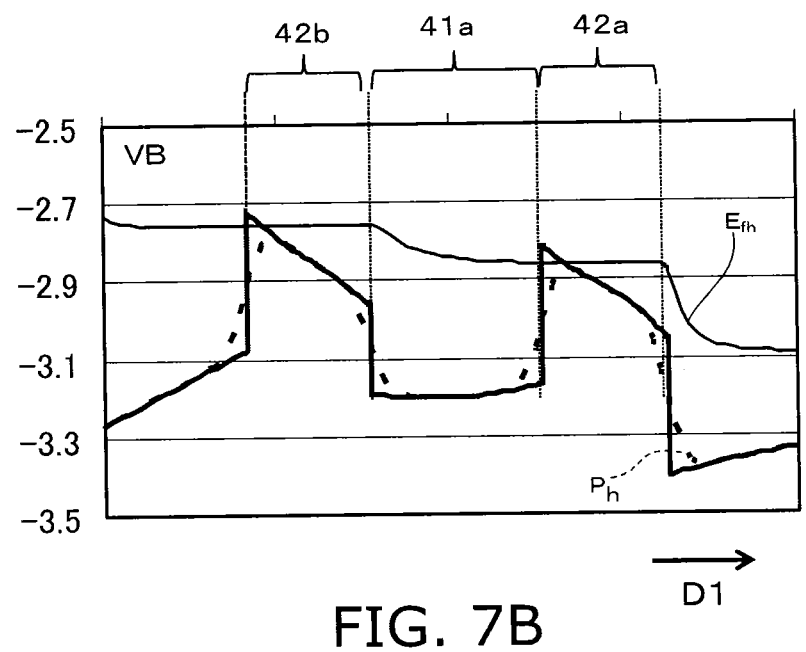

FIGS. 7A and 7B are energy band diagrams according to the second reference example.

FIG. 7A is an energy band diagram of the conduction band CB; and FIG. 7B is an energy band diagram of the valence band VB.

The reference numerals of the quantum potentials, etc., of FIGS. 7A and 7B are similar to those of FIGS. 6A and 6B.

As shown in FIGS. 7A and 7B, the curve of the valence band VB of the first barrier layer 41a relaxes because the In composition ratio of the first barrier layer 41a gradually decreases in the D1 direction. Thereby, the hole injection efficiency increases.

However, in the case where the In composition ratio $C_{b1}$ on the side of the first barrier layer 41a contacting the second well layer 42b is high, although the modulation of the energy level due to the piezoelectric field is suppressed, there is a possibility that the crystallinity of the first well layer 42a may degrade.

Conversely, the semiconductor light emitting device 110 of the first embodiment has characteristics such as those recited below.

Figure 8A:
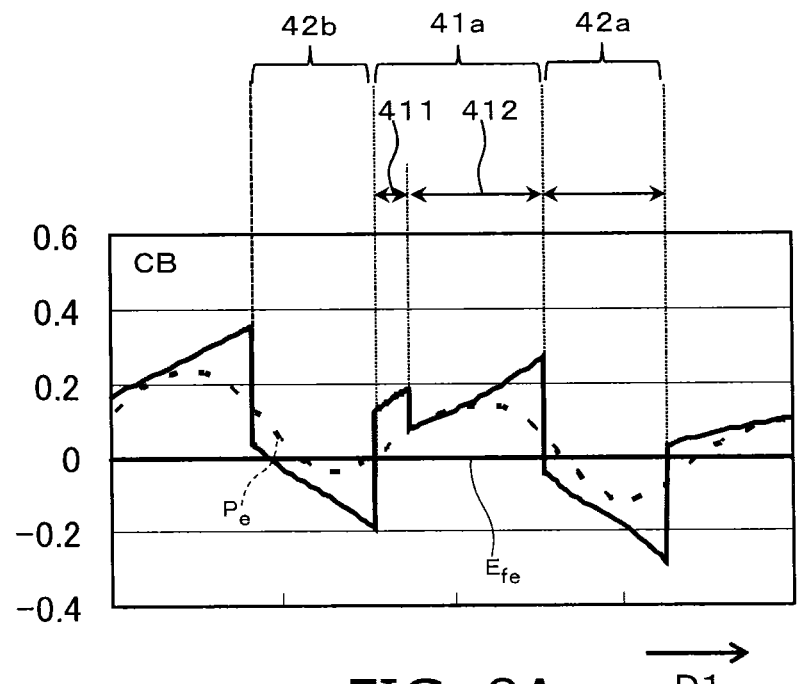
FIGS. 8A and 8B are energy band diagrams according to the first embodiment.
Figure 8B:
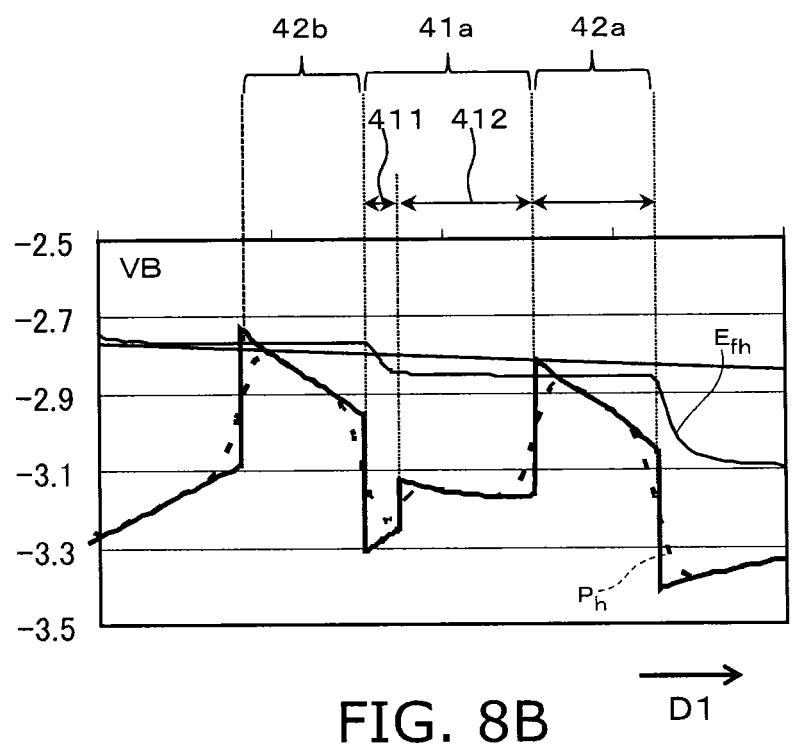

FIGS. 8A and 8B are energy band diagrams according to the first embodiment.

FIG. 8A is an energy band diagram of the conduction band CB; and FIG. 8B is an energy band diagram of the valence band VB.

The reference numerals of the quantum potentials, etc., of FIGS. 8A and 8B are similar to those of FIGS. 6A and 6B.

As shown in FIGS. 8A and 8B, in the first embodiment as well, the curve of the valence band VB of the first barrier layer 41a relaxes. By the second portion 412 being provided inside the first barrier layer 41a, the piezoelectric field of this portion is relaxed.

The first portion 411 is provided in contact with the second well layer 42b. The quantum potential $P_h$ of the holes has a gradual gradient between the first portion 411 and the second portion 412. The first portion 411 is not an injection barrier to the holes. As described above, the holes pass through the first portion 411 due to the tunneling. The holes are injected stably at least from the first barrier layer 41a toward the second well layer 42b.

The quasi Fermi level $E_{fh}$ of the holes has a gradual gradient between the first portion 411 and the second portion 412. Because the first portion 411 is thin enough that the tunneling occurs, the distribution of the holes is undisturbed. The holes are not trapped between the first portion 411 and the second portion 412.

The first barrier layer 41a which includes the first portion 411 and the second portion 412 is provided on the side of the light emitting layer 40 most proximal to the p-side semiconductor layer 50. Thereby, as recited above, the holes are efficiently injected into the MQW.

Characteristics of the semiconductor light emitting devices will now be described using FIGS. 9A and 9B.

Figure 9A:
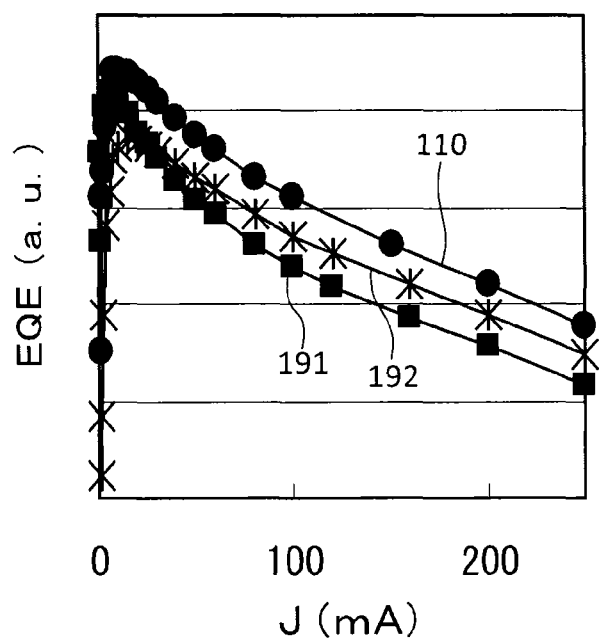
FIGS. 9A and 9B are graphs showing characteristics of the semiconductor light emitting device of the first embodiment and the semiconductor light emitting devices of the reference examples.
Figure 9B:
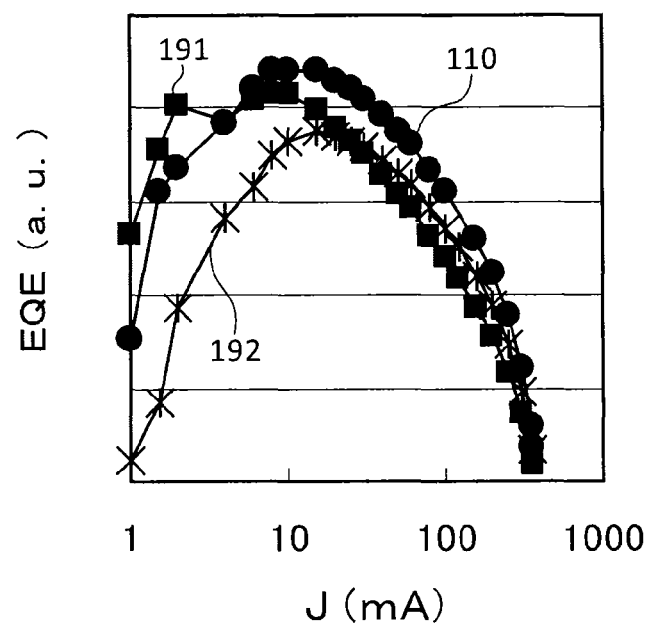

FIGS. 9A and 9B are graphs showing characteristics of the semiconductor light emitting device of the first embodiment and the semiconductor light emitting devices of the reference examples.

In FIG. 9A, the horizontal axis is a current J (milliamperes (mA)); and the vertical axis is an external quantum efficiency EQE (arbitrary units).

Other than the horizontal axis being logarithmic, FIG. 9B is similar to FIG. 9A.

For the first well layer 42a, similarly to the first well layer 42a of FIG. 11A described below, a semiconductor light emitting device having an In composition ratio that gradually increases in the D1 direction is used in the measurements. Even in the case where the first well layer 42a has a constant In composition ratio, etc., it is considered that the results are similar to those of FIGS. 9A and 9B.

As shown in FIGS. 9A and 9B, compared to the semiconductor light emitting device 191 of the first reference example, the semiconductor light emitting device 192 of the second reference example has a high external quantum efficiency EQE in the high current region. Further, compared to the semiconductor light emitting device 191 of the first reference example and the semiconductor light emitting device 192 of the second reference example, the semiconductor light emitting device 110 of the first embodiment has a high external quantum efficiency EQE regardless of the current region.

Thus, by the second portion 412 being provided in the first embodiment, the curve of the valence band due to the piezoelectric field is relaxed. Thereby, the hole injection efficiency into the light emitting layer 40 increases. Also, by the first portion 411 being provided, the crystallinity improves for the layers stacked further in the D1 direction than the first portion 411. Thereby, the luminous efficiency of the semiconductor light emitting device 110 increases.

Modifications of the first embodiment will now be described.

FIG. 10A to FIG. 12C show the profiles of the In composition ratios according to the modifications of the first embodiment.

Figure 10A:
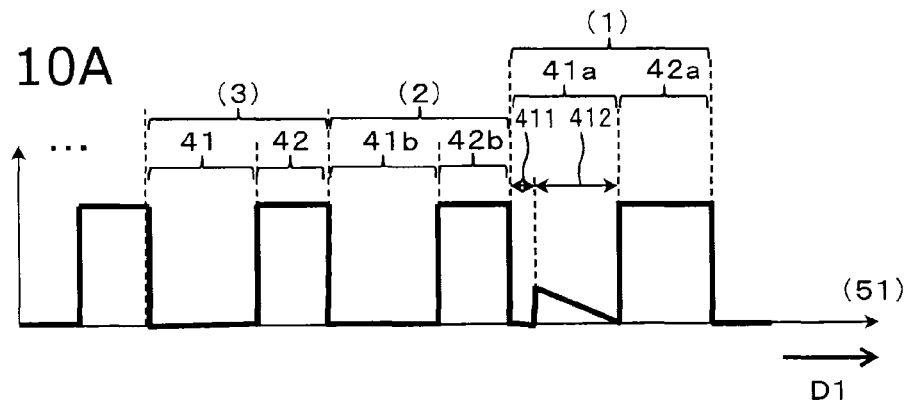
FIG. 10A to FIG. 12C show the profiles of the In composition ratios according to the modifications of the first embodiment.

As shown in FIG. 10A, for example, the first barrier layer 41a which includes the first portion 411 and the second portion 412 is provided only on the side most proximal to the second semiconductor layer 50. Other than the first barrier layer 41a, the In composition ratios of the barrier layers 41 may be constant. For example, other than the first barrier layer 41a, the barrier layers 41 are made of GaN.

Here, the barrier layer 41 of the light emitting layer 40 which is the MQW into which the holes are initially injected is the first barrier layer 41a which is provided on the side most proximal to the second semiconductor layer 50. It is favorable for the hole injection efficiency into the first barrier layer 41a to be high. Because at least the first barrier layer 41a which is provided on the side most proximal to the second semiconductor layer 50 includes the first portion 411 and the second portion 412, the hole injection efficiency into the light emitting layer 40 stably increases.

Figure 10B:
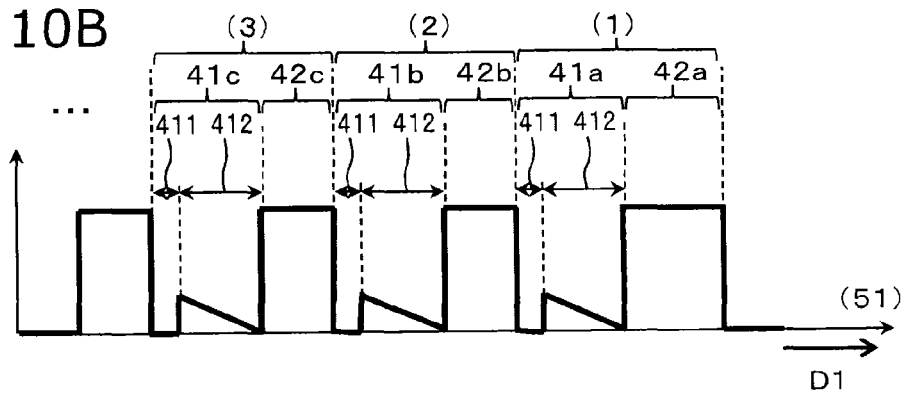

As shown in FIG. 10B, for example, the second barrier layer 41b contacting the second well layer 42b includes the first portion 411 and the second portion 412. Similarly, the Nth barrier layer 41 contacting the Nth well layer 42 also includes the first portion 411 and the second portion 412. Thus, each of the multiple barrier layers 41 may include the first portion 411 and the second portion 412. Thereby, the hole injection efficiency into each of the well layers 42 increases.

Figure 10C:
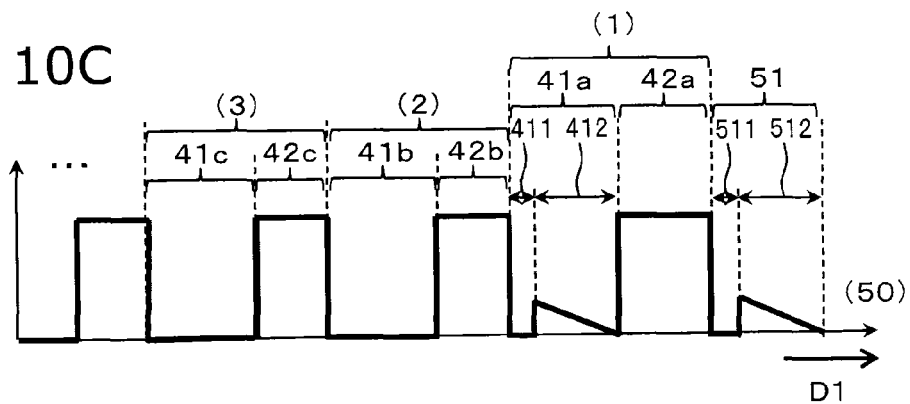

As shown in FIG. 10C, for example, similarly to the first barrier layer 41a, the intermediate layer 51 may include a first portion 511 and a second portion 512. The first portion 511 is provided on the first well layer 42a side of the second semiconductor layer 50 to contact the first well layer 42a. The second portion 512 contacts the first portion 511. The second portion 512 includes a first region that has a first In composition ratio that is higher than the In composition ratio of the first portion 511, and a second region that is provided upward from the first region and has a second In composition ratio that is lower than the first composition ratio. Thereby, the curve of the valence band of the intermediate layer 51 relaxes. Thereby, the hole injection efficiency into the light emitting layer 40 increases due to the increase of the hole injection efficiency into the intermediate layer 51.

Figure 10D:
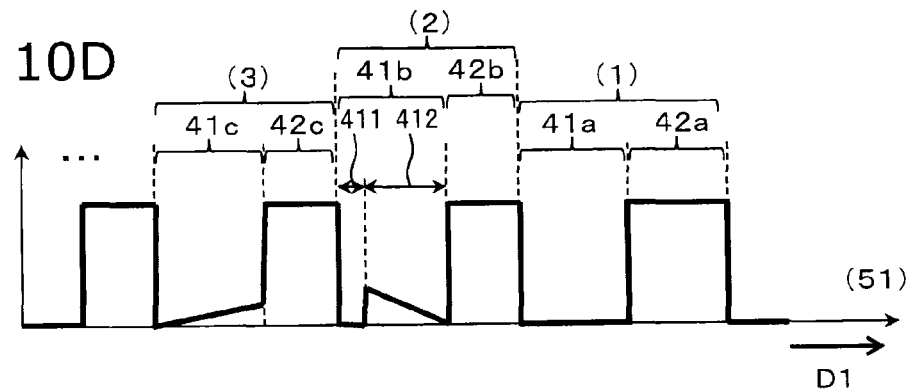

As shown in FIG. 10D, for example, the barrier layer 41 including the first portion 411 and the second portion 412 may not be disposed on the side of the light emitting layer most proximal to the second semiconductor layer 50. In other words, it is sufficient for the barrier layer 41 including the first portion 411 and the second portion 412 to be at least one of the second barrier layer 41b to the Nth barrier layer 41.

In the example shown in FIG. 10D, the first portion 411 and the second portion 412 are provided in the second barrier layer 41b. On the other hand, the In composition ratio of the first barrier layer 41a is constant. In the modification as well, the luminous efficiency of the light emitting layer 40 increases due to the increase of the hole injection efficiency of the second barrier layer 41b.

As shown in FIG. 10D, a barrier layer 41 having an In composition ratio that is tilted to be opposite to the In composition ratio of the second portion 412 may be provided.

In the example shown in FIG. 10D, the tilt of the In composition ratio of a third barrier layer 41c is opposite to the tilt of the In composition ratio of the second portion 412. The In composition ratio of the third barrier layer 41c on the third well layer 42c side is higher than the In composition ratio on the first semiconductor layer 20 side.

Figure 11A:
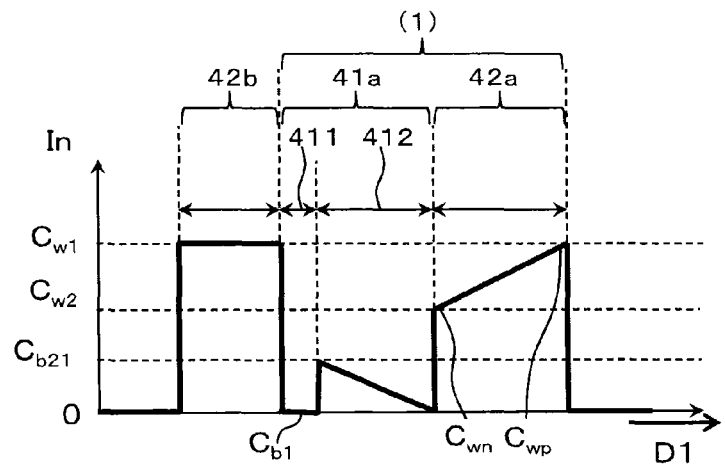

As shown in FIG. 11A, for example, an In composition ratio $C_{wp}$ of the first well layer 42a on the second semiconductor layer 50 side may be higher than an In composition ratio $C_{wn}$ on the first barrier layer 41a side. For example, the first well layer 42a has an In composition ratio that gradually increases in the D1 direction.

Here, as described above, the piezoelectric field that is formed in the first well layer 42a is in a direction that is the reverse of that of the piezoelectric field of the first barrier layer 41a due to the difference between the lattice constant of the first barrier layer 41a and the lattice constant of the first well layer 42a. The piezoelectric field inside the first well layer 42a relaxes by the first well layer 42a having the In composition ratio that gradually increases in the D1 direction. Thereby, the hole injection efficiency of the first well layer 42a increases.

In the case where the light emission color of the semiconductor light emitting device 110 is blue, it is favorable for the In composition ratio $C_{wn}$ of the first well layer 42a on the first barrier layer 41a side to be greater than 0.08 and not more than 0.1. It is favorable for the In composition ratio $C_{wp}$ of the first well layer 42a on the second semiconductor layer 50 side to be not less than 0.12. For example, it is more favorable for the In composition ratio $C_{wp}$ to be 0.14. It is favorable for the difference ($C_{wp}-C_{wn}$) between the In composition ratio $C_{wp}$ of the first well layer 42a on the second semiconductor layer 50 side and the In composition ratio $C_{wn}$ of the first well layer 42a on the first barrier layer 41a side to be not less than 0.06. By the In composition ratio of the first well layer 42a being within these numerical ranges, the degradation of the crystallinity of the first well layer 42a can be suppressed. The In composition ratio of the first well layer 42a may gradually increase in the D1 direction or may change nonlinearly. For example, the In composition ratio of the first well layer 42a may increase in a stairstep configuration in the D1 direction.

Figure 11B:
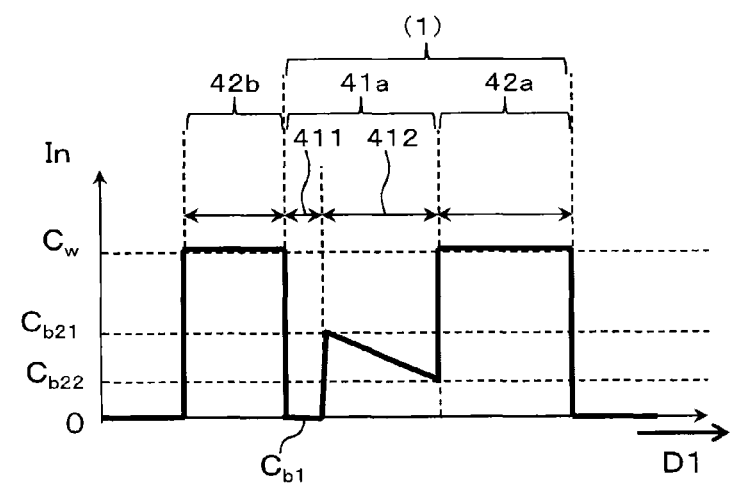

As shown in FIG. 11B, the second In composition ratio $C_{b22}$ of the second region 412b of the second portion 412 of the first barrier layer 41a may be higher than the In composition ratio $C_{b1}$ of the first portion 411. As described above, the piezoelectric field is relaxed if the first In composition ratio $C_{b21}$ of the first region 412a of the second portion 412 of the first barrier layer 41a is higher than the second In composition ratio $C_{b22}$ of the second region 412b of this portion.

Figure 11C:
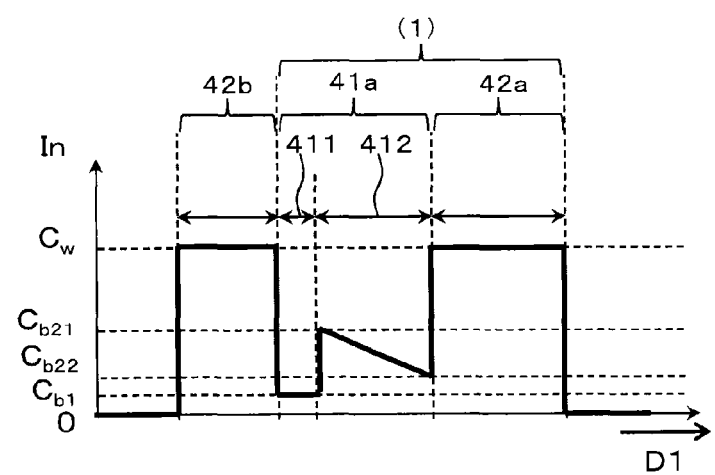

As shown in FIG. 11C, the In composition ratio $C_{b1}$ of the first portion 411 may be greater than 0. As described above, the first portion 411 is more of a barrier to the holes as the thickness of the first portion 411 increases. Therefore, it is favorable for the thickness of the first portion 411 to be less than 2 nm.

Figure 12A:
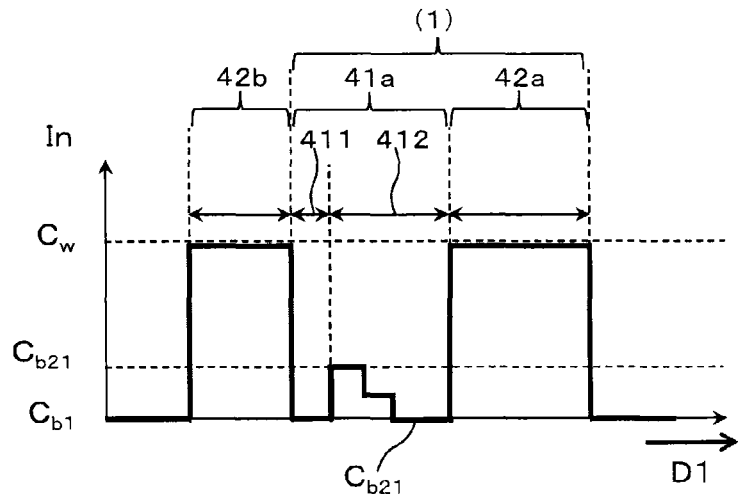

As shown in FIG. 12A, the In composition ratio of the second portion 412 gradually decreases in the D1 direction. The In composition ratio of the second portion 412 may decrease nonlinearly in the D1 direction. In such a case, for example, the In composition ratio of the second portion 412 may decrease in a stairstep configuration from the first In composition ratio $C_{b21}$ to the second In composition ratio $C_{b22}$.

Figure 12B:
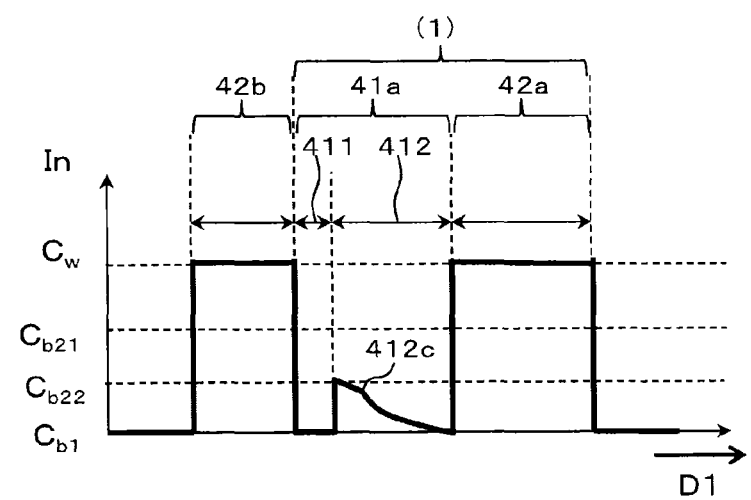

As shown in FIG. 12B, the In composition ratio of the second portion 412 may include a flexion point 412c. The change amount of the In composition ratio of the D1 direction of the second portion 412 on the second well layer 42b side of the flexion point 412c is less than the change amount on the first well layer 42a side of the flexion point 412c.

Figure 12C:
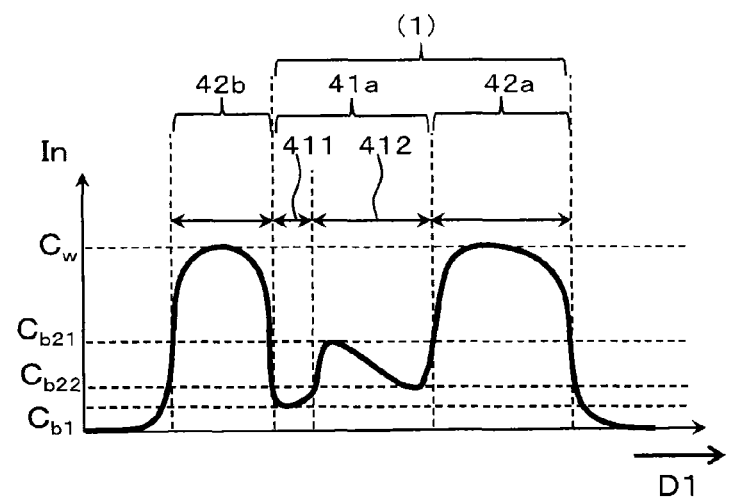

As shown in FIG. 12C, for example, the In composition ratio of the light emitting layer 40 may change continuously. For example, in the crystal, there is a possibility that migration of the In may occur in micro regions of the interfaces of the layers. In the case where the In composition of the light emitting layer 40 is analyzed by secondary ion mass spectroscopy (SIMS), the case also may be considered where the In composition ratio changes continuously. Accordingly, the light emitting layer 40 may have an In composition ratio defined as follows.

For example, the absolute value of the change rate in the thickness direction (the D1 direction) of the In composition ratio of the second portion 412 is less than the absolute value of the change rate in the thickness direction of the In composition ratio on the first portion 411 side of the second well layer 42b. "The change rate in the thickness direction (the D1 direction) of the In composition ratio of the second portion 412" may be reworded as the change amount of the In composition ratio per unit thickness of the second portion 412. Specifically, for example, "the change rate in the thickness direction (the D1 direction) of the In composition ratio of the second portion 412" is the change rate of the second portion 412 from the first In composition ratio $C_{b21}$ of the first region 412a to the second In composition ratio $C_{b22}$ of the second region 412b. For example, "the change rate in the thickness direction of the In composition ratio on the first portion 411 side of the second well layer 42b" is the change rate from the maximum point of the In composition ratio of the second well layer 42b to the In composition ratio of the boundary between the second well layer 42b and the first portion 411. In the case where the In composition ratio of the second well layer 42b has multiple maximum points, the change rate of the In composition ratio recited above is the change rate from the maximum point of the maximum points of interest that is proximal to the first portion 411.

For example, the absolute value of the change rate in the thickness direction of the In composition ratio of the second portion 412 is greater than the absolute value of the change rate in the thickness direction of the In composition ratio on the second portion 412 side of the first portion 411. Specifically, for example, "the change rate in the thickness direction of the In composition ratio on the second portion 412 side of the first portion 411" is the change rate from the minimum point of the In composition ratio of the first portion 411 to the In composition ratio of the boundary between the first portion 411 and the second portion 412. In the case where the In composition ratio of the first portion 411 has multiple minimum points, the change rate of the In composition ratio recited above is the change rate from the minimum point that is proximal to the second portion 412.

In the case where the boundaries between the layers are not distinct, the boundaries between the layers are taken to be the positions of the flexion points of the change amount of the In composition ratio with respect to the thickness.

In the case where the In composition ratio of the light emitting layer 40 changes continuously, by the change amount of the In composition ratio with respect to the thickness satisfying the conditions recited above, according to the first embodiment, the curve of the valence band due to the piezoelectric field is relaxed by the second portion 412; and the crystallinity improves due to the first portion 411.

The effects of the first embodiment can be obtained from any of the examples shown in FIG. 10A to FIG. 12C recited above.

The profile of the increase/decrease of the In composition ratio may be other than those recited above. The profile may be an appropriate combination of the profiles of FIG. 10A to FIG. 12C.

Second Embodiment

Figure 13:
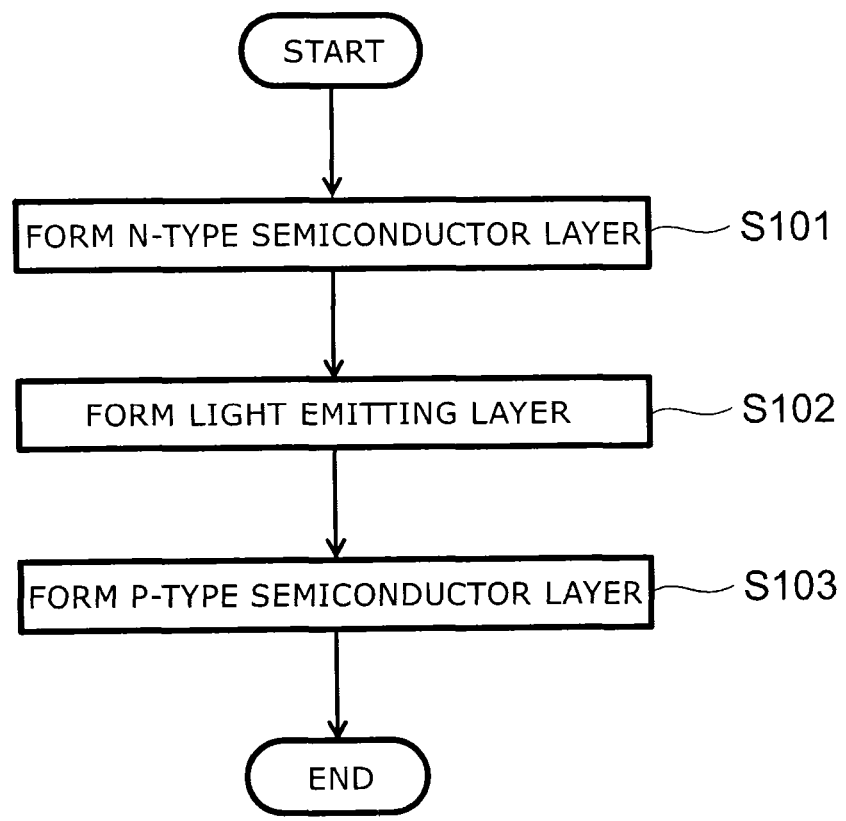
FIG. 13 is a flowchart showing a method for manufacturing a semiconductor light emitting device according to a second embodiment.

FIG. 13 is a flowchart showing a method for manufacturing a semiconductor light emitting device according to a second embodiment.

As shown in FIG. 13, the method for manufacturing the semiconductor device according to the embodiment includes forming an n-type semiconductor layer (step S101), forming a light emitting layer (step S102), and forming a p-type semiconductor layer (step S103). Specific examples of the steps will now be described.

First, in the formation of the n-type semiconductor layer of step S101, the first semiconductor layer 20 including a nitride semiconductor is formed.

Then, in the formation of the light emitting layer of step S102, the light emitting layer 40 is formed on the first semiconductor layer 20. The details of step S102 are described below.

Continuing, in the formation of the second semiconductor layer of step S103, a second semiconductor layer including the nitride semiconductor is formed on the light emitting layer 40.

The formation of the light emitting layer of step S102 includes a process of forming the second well layer 42b on the first semiconductor layer 20, a process of forming the first barrier layer 41a having an In composition ratio lower than the In composition ratio of the second well layer 42b to contact the second well layer 42b, and a process of forming the first well layer 42a having an In composition ratio higher than the In composition ratio of the first barrier layer 41a to contact the first barrier layer 41a.

The process of forming the first barrier layer 41a includes a process of forming the first portion 411 to contact the second well layer 42b, and a process of forming the second portion 412 having the first region 412a and the second region 412b, where the first region 412a contacts the first portion 411 and has the first In composition ratio $C_{b21}$ that is higher than the In composition ratio $C_{b1}$ of the first portion 411, and the second region 412b contacts the first region 412a and has the second In composition ratio $C_{b22}$ that is lower than the first In composition ratio $C_{b21}$.

The luminous efficiency of the light emitting layer 40 increases due to the processes of step S101 to step S103 recited above.

A more detailed specific example of the method for manufacturing the semiconductor device according to the second embodiment will now be described.

First, for example, the substrate 10 of c-plane sapphire is subjected to organic cleaning and acid cleaning, is introduced to the reactor of a MOCVD (Metal Organic Chemical Vapor Deposition) apparatus, and is heated on the susceptor of the reactor at about 1100° C. Thereby, the oxide film of the surface of the substrate 10 is removed.

Then, the formation of the first semiconductor layer (step S101) is performed.

The buffer layer 11 is grown with a thickness of 30 nm on the major surface (the c-plane) of the substrate 10. Then, the undoped GaN foundation layer 21 is grown with a thickness of 3 micrometers (μm) on the buffer layer 11. Continuing, the n-type GaN contact layer 22 is grown with a thickness of 2 μm on the GaN foundation layer 21 using Si doped GaN. The Ga source-material gas is, for example, trimethylgallium (TMGa). The group V source-material gas is ammonia ($NH_3$).

Then, the stacked body 30 is formed on the n-type GaN contact layer 22 by alternately stacking 30 periods of a first crystal layer 31 which is $In_xGa_{1-x}N$ and a second crystal layer 32 which is $In_yGa_{1-y}N$. The In source-material gas is, for example, trimethylindium (TMI).

Continuing, the formation of the light emitting layer 40 (step S102) is performed.

For example, as recited below, N periods of the barrier layer 41 and the well layer 42 are alternately stacked on the stacked body 30. N is an integer not less than 2. The barrier layer 41 and the well layer 42 on the side that is stacked first are the Nth barrier layer 41 and the Nth well layer 42, respectively. For example, N is 8.

For example, the Nth barrier layer 41 is formed on the stacked body 30 at a first temperature $T_{g1}$. The In composition ratio of the Nth barrier layer 41 is lower than at least the In composition ratio of the Nth well layer described below. For example, in the formation of the Nth barrier layer 41, a flow rate $F_{TMI}$ of the In source-material gas is constant at 0. In other words, the In source-material gas is not supplied.

Then, the Nth well layer 42 is formed at a second temperature $T_{g2}$ that is lower than the first temperature $T_{g1}$. In the formation of the Nth well layer 42, the flow rate $F_{TMI}$ of the In source material is higher than the flow rate of the formation of the Nth barrier layer 41. For example, in the formation of the Nth well layer 42, the flow rate $F_{TMI}$ of the In source-material gas is constant at $F_w$. For example, the In composition ratio of the Nth well layer 42 is 0.13.

Then, similarly to the Nth barrier layer 41, the (N−1)th barrier layer 41 is formed on the Nth well layer 42. Continuing, similarly to the Nth well layer 42, the (N−1)th well layer 42 is formed on the (N−1)th barrier layer 41. The well layers up to the third well layer 42 are formed by repeating these processes.

The processes of forming the second barrier layer 41b to the first well layer 42 will now be described using FIGS. 14A and 14B.

Figure 14A:
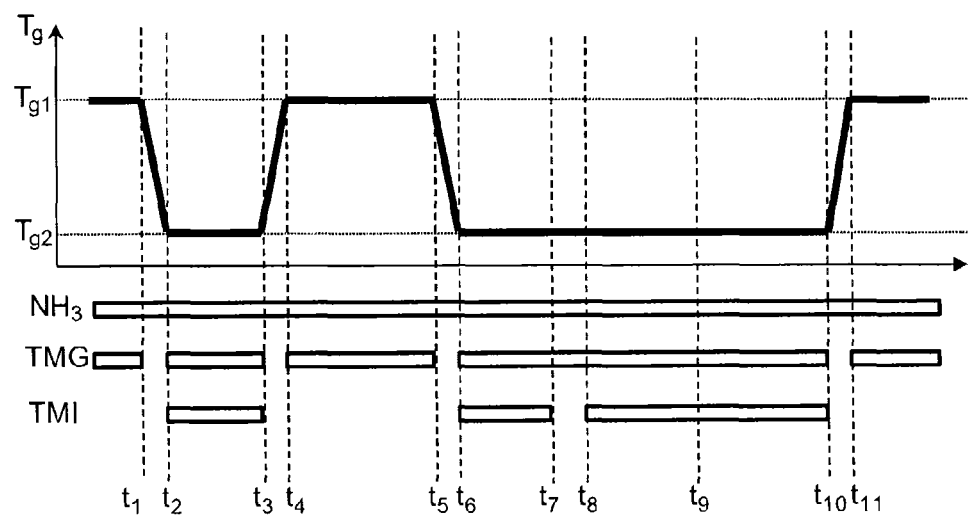
FIGS. 14A and 14B are schematic cross-sectional views showing the method for manufacturing the semiconductor device according to the second embodiment.
Figure 14B:
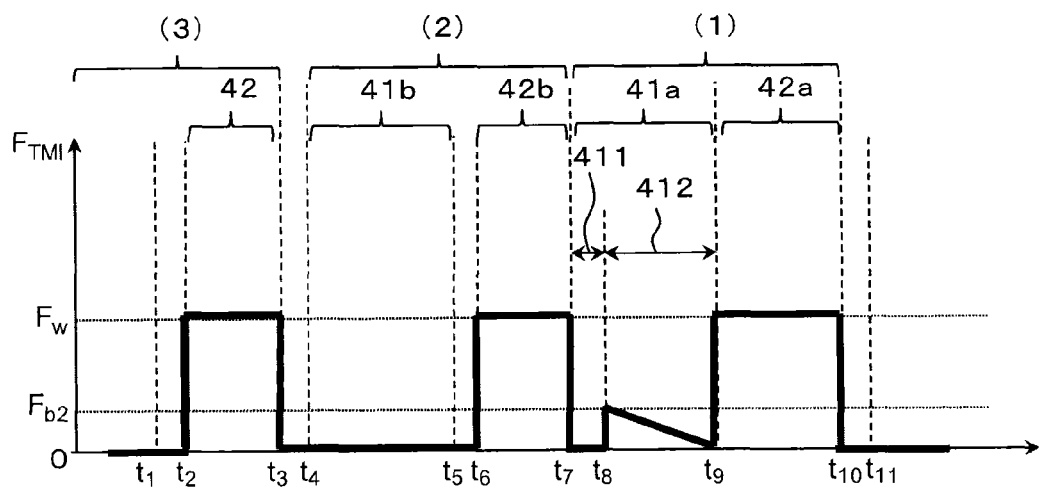

FIGS. 14A and 14B are schematic cross-sectional views showing the method for manufacturing the semiconductor device according to the second embodiment.

FIG. 14A shows the temperature profile and the introduction timing of the reactant gas when forming the light emitting layer 40 by MOCVD. In this drawing, the horizontal axis is the time t. The vertical axis is the temperature $T_g$. The state of the introduction of the source-material gases is shown to match the horizontal axis.

The introduction of the Ga source-material gas is stopped at time $t_1$ after forming the third barrier layer 41. From time $t_1$ to time $t_2$, the temperature $T_g$ is reduced from the first temperature $T_{g1}$ to the second temperature $T_{g2}$.

Here, it is favorable for the second temperature $T_{g2}$ to be not less than 800° C. It is favorable for the difference between the first temperature $T_{g1}$ and the second temperature $T_{g2}$ to be less than 100° C. and not less than 20° C., and more favorably less than 80° C. and not less than 40° C. Thereby, the in-plane fluctuation of the In composition ratio at the interface of the barrier layer 41 and the well layer 42 is reduced; and the surface roughness of the interface is reduced.

Then, at time $t_2$, the introduction of the Ga source-material gas and the In source-material gas is started. The flow rate $F_{TMI}$ of the In source-material gas is constant at $F_w$. From time $t_2$ to time $t_3$, the third well layer 42 is formed on the third barrier layer 41 at the second temperature $T_{g2}$. For example, the In composition ratio of the third well layer 42 is 0.13.

Continuing, the introduction of the Ga source-material gas and the In source-material gas is stopped at time $t_3$. From time $t_3$ to time $t_4$, the temperature $T_g$ is increased from the second temperature $T_{g2}$ to the first temperature $T_{g1}$.

Then, at time $t_4$, for example, the introduction of only the Ga source-material gas is started. The In source-material gas is not supplied. From time $t_4$ to time $t_5$, the second barrier layer 41b is formed on the third well layer 42 at the first temperature $T_{g1}$. Thereby, the second barrier layer 41b having an In composition ratio that is lower than the In composition ratio $C_w$ of the second well layer 42b described below is formed.

Thus, the barrier layers 41 from the Nth barrier layer 41 to the second barrier layer 41b are formed at the first temperature $T_{g1}$ that is higher than the second temperature $T_{g2}$. The crystallinity of the barrier layers 41 from the Nth barrier layer 41 to the second barrier layer 41b improves. Thereby, the crystallinity of the well layer 42 adjacent to the barrier layers 41 also improves.

Then, at time $t_5$, the introduction of the Ga source-material gas is stopped. From time $t_5$ to time $t_6$, the temperature $T_g$ is reduced from the first temperature $T_{g1}$ to the second temperature $T_{g2}$.

Continuing, at time $t_6$, the introduction of the Ga source-material gas and the In source-material gas is started. The flow rate $F_{TMI}$ of the In source-material gas is constant at $F_w$. From time $t_6$ to time $t_7$, the second well layer 42 is formed on the second barrier layer 41 at the second temperature $T_{g2}$. For example, the In composition ratio of the second well layer 42 is 0.13.

Then, at time $t_7$, for example, the introduction of only the In source-material gas is stopped. Thereby, only the Ga source material is supplied. From time $t_7$ to time $t_8$, the temperature $T_g$ remains constant at the second temperature $T_{g2}$; and the first portion 411 of the first barrier layer 41a is formed to contact the second well layer 42. The time from time $t_7$ to time $t_8$ is controlled such that the thickness of the first portion 411 is greater than 0 nm and less than 2 nm. For example, the thickness of the first portion 411 is 1 nm.

Continuing, at time $t_8$, for example, the introduction of the In source-material gas is restarted. At time $t_8$, the flow rate $F_{TMI}$ of the In source-material gas is set to be, for example, $F_{b2}$ that is larger than the In source-material gas flow rate in the formation of the first portion 411. In such a case, $0 < F_{b2} < F_w$. Thereby, the first region 412a that has the first In composition ratio $C_{b21}$ that is higher than the In composition ratio $C_{b1}$ of the first portion 411 is formed to contact the first portion 411.

Then, from time $t_8$ to time $t_9$, the temperature $T_g$ remains constant at the second temperature $T_{g2}$; and the flow rate $F_{TMI}$ of the In source-material gas is gradually reduced. At time $t_9$, the flow rate $F_{TMI}$ of the In source-material gas is reduced to a flow rate of the In source-material gas that is lower than the flow rate of the In source-material gas in the formation of the first region 412a. For example, the flow rate $F_{TMI}$ of the In source-material gas is set to be 0. Thereby, the second region 412b that has the second In composition ratio $C_{b22}$ that is lower than the first In composition ratio $C_{b21}$ is formed to contact the first region 412a. For example, the thickness of the first barrier layer 41a is set to be 5 nm.

Thus, from time $t_7$ to time $t_9$, the second portion 412 that has the first region 412a and the second region 412b is formed. In the formation of the first barrier layer 41a, the first portion 411 and the second portion 412 are formed at the second temperature $T_{g2}$. By forming the first barrier layer 41a without changing the temperature, the crystallinity does not degrade; and an In composition ratio profile that does not change steeply can be formed.

At time $t_9$, the flow rate $F_{TMI}$ of the In source-material gas is set to be, for example, F, that is larger than the In source gas flow rate of the formation of the first portion 411. From time $t_9$ to time $t_{10}$, the temperature $T_g$ remains constant at the second temperature $T_{g2}$. Thereby, the first well layer 42a that has an In composition ratio that is higher than the In composition ratio of the first barrier layer 41a is formed to contact the first barrier layer 41a. For example, the thickness of the first well layer 42a is 5 nm.

As shown in FIG. 11A, the first well layer 42a having an In composition ratio that gradually increases in the D1 direction may be formed. In such a case, from time $t_9$ to time $t_{10}$, the flow rate $F_{TMI}$ of the In source-material gas may gradually decrease.

Then, at time $t_{10}$, for example, the introduction of only the In source-material gas is stopped. From time $t_{10}$ to time $t_{11}$, the temperature $T_g$ is increased from the second temperature $T_{g2}$ to the first temperature $T_{g1}$. From time $t_{11}$, the second semiconductor layer 50 is formed on the light emitting layer 40.

Continuing, the formation of the second semiconductor layer (step S103) is performed.

An AlGaN layer having a composition ratio of Al of 0.003 and a thickness of 5 nm is grown on the uppermost barrier layer 41; and subsequently, the Mg doped AlGaN layer 51 having a composition ratio of Al of 0.1 and a thickness of 10 nm, the Mg doped p-type GaN layer 52 (having a Mg concentration of $2 \times 10^{19}/cm^3$) having a thickness of 80 nm, and the high-concentration Mg doped GaN layer 53 (having a Mg concentration of $1 \times 10^{21}/cm^3$) having a thickness of about 10 nm are stacked. Subsequently, the substrate 10 on which the crystals recited above are grown is extracted from the reactor of the MOCVD apparatus.

Then, a portion of the multilayered film structure recited above is subjected to dry etching to expose the multilayered film structure partway through the n-type GaN contact layer 22; and the n-side electrode 70 of Ti/Pt/Au is formed on the exposed portion. The transparent electrode 60 which is ITO (Indium Tin Oxide) is formed on the surface of the high-concentration Mg doped GaN layer 53; and the p-side electrode 80 of Ni/Au having, for example, a diameter of 80 μm is formed on a portion of the transparent electrode 60. Thereby, the semiconductor light emitting device 110 is made.

In the second embodiment, a semiconductor light emitting device that has a higher luminous efficiency can be provided. Specifically, the curve of the valence band due to the piezoelectric field is relaxed by forming the second portion 412. Thereby, the hole injection efficiency into the light emitting layer 40 increases. Also, the crystallinity improves for the layers stacked further in the D1 direction than the first portion 411 by forming the first portion 411. Thereby, the luminous efficiency of the semiconductor light emitting device 110 increases.

Although an example is described in the embodiments recited above in which MOCVD (metal-organic vapor phase epitaxy) is used as the film formation method, other methods such as, for example, molecular beam epitaxy (MBE), hydride vapor phase epitaxy (HVPE), etc., also are applicable.

According to the embodiments recited above, a semiconductor light emitting device having a high luminous efficiency is provided.

In the specification, "nitride semiconductor" includes all compositions of semiconductors of the chemical formula $B_\alpha In_\beta Al_\gamma Ga_{1-\alpha-\beta-\gamma}N$ ($0 \leq \alpha \leq 1$, $0 \leq \beta \leq 1$, $0 \leq \gamma \leq 1$, and $\alpha+\beta+\gamma \leq 1$) for which the composition ratios $\alpha$, $\beta$, and $\gamma$ are changed within the ranges respectively. "Nitride semiconductor" further includes group V elements other than N (nitrogen) in the chemical formula recited above and/or any dopants added to control the conductivity type, etc.

Hereinabove, exemplary embodiments of the invention are described with reference to specific examples. However, the invention is not limited to these specific examples. For example, one skilled in the art may similarly practice the invention by appropriate selections from known art including various modifications made by one skilled in the art in regard to the configurations, the sizes, the material properties, the arrangements, etc., of specific configurations of components included in the semiconductor light emitting device such as the first semiconductor layer, the second semiconductor layer, the active layer, the well layer, the barrier layer, the electrode, the substrate, the buffer layer, and the like; and such practice is included in the scope of the invention to the extent that similar effects are obtained.

Further, any two or more components of the specific examples may be combined within the extent of technical feasibility and are included in the scope of the invention to the extent that the spirit of the invention is included.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor light emitting device, comprising:
    a first semiconductor layer of a first conductivity type including a nitride semiconductor;
    a second semiconductor layer of a second conductivity type provided on a [0001]-direction side of the first semiconductor layer, the second semiconductor layer including the nitride semiconductor; and
    a light emitting layer provided between the first semiconductor layer and the second semiconductor layer, the light emitting layer including the nitride semiconductor,
    the light emitting layer including:
        a first well layer provided between the first semiconductor layer and the second semiconductor layer;
        a second well layer provided between the first well layer and the first semiconductor layer; and
        a first barrier layer provided between the second well layer and the first well layer to contact the second well layer and the first well layer, an In composition ratio of the first barrier layer being lower than an In composition ratio of the first well layer and an In composition ratio of the second well layer,
    the first barrier layer including:
        a first portion provided between the first well layer and the second well layer, the first portion being in contact with the second well layer, the first portion having a first thickness in a first direction from the first semiconductor layer toward the second semiconductor layer; and a second portion provided between the first portion and the first well layer, the second portion having a first region and a second region, the first region being in contact with the first portion, the second region provided between the first region and the first well layer, the second region being in contact with the first well layer, the first region having a first In composition ratio higher than an In composition ratio of the first portion, the second region having a second In composition ratio lower than the first In composition ratio.

2. The device according to claim 1, wherein the first thickness is less than 2 nanometers.

3. The device according to claim 1, wherein the first thickness is not more than 1 nanometer.

4. The device according to claim 1, wherein an In composition ratio of the second portion gradually decreases in a direction from the first semiconductor layer toward the second semiconductor layer.

5. The device according to claim 4, wherein the In composition ratio of the second portion decreases in a stairstep configuration from the first In composition ratio to the second In composition ratio.

6. The device according to claim 1, wherein the In composition ratio of the first portion is lower than 0.02.

7. The device according to claim 1, wherein the In composition ratio of the first portion is lower than 0.01.

8. The device according to claim 1, wherein the first In composition ratio is higher than 0.02.

9. The device according to claim 1, wherein the first In composition ratio is not less than 0.04.

10. The device according to claim 1, wherein a thickness of the first barrier layer in the first direction is not more than 10 nanometers.

11. The device according to claim 1, wherein a thickness of the first well layer in the first direction is not less than 2.5 nanometers and not more than 6 nanometers.

12. The device according to claim 1, wherein a minimum value of the In composition ratio of the first portion is not more than 0.05.

13. The device according to claim 1, wherein the absolute value of a change rate in the first direction of an In composition ratio of the second portion is less than the absolute value of a change rate in the first direction of an In composition ratio of the second well layer on the first portion side.

14. The device according to claim 1, wherein the absolute value of a change rate in the first direction of an In composition ratio of the second portion is greater than the absolute value of a change rate in the first direction of an In composition ratio of the first portion on the second portion side.

15. The device according to claim 1, wherein
the light emitting layer further includes a second barrier layer, and
the second barrier layer is provided between the first semiconductor layer and the second well layer to contact the second well layer, an In composition ratio of the second barrier layer being lower than the In composition ratio of the second well layer.

16. The device according to claim 15, wherein
the light emitting layer further includes a third well layer, and
the third well layer is provided between the first semiconductor layer and the second barrier layer to contact the second barrier layer, an In composition ratio of the third well layer being higher than the In composition ratio of the second barrier layer.

17. The device according to claim 1, wherein
the second semiconductor layer includes an intermediate layer including the nitride semiconductor, and the nitride semiconductor includes Al, and
the intermediate layer is provided on a side of the second semiconductor layer most proximal to the light emitting layer.

18. A method for manufacturing a semiconductor light emitting device, comprising:
forming a first semiconductor layer of a first conductivity type including a nitride semiconductor;
forming a light emitting layer on the first semiconductor layer; and
forming a second semiconductor layer of a second conductivity type on the light emitting layer, the second semiconductor layer including the nitride semiconductor,
the forming of the light emitting layer including:
forming a second well layer on the first semiconductor layer;
forming a first barrier layer to contact the second well layer, an In composition ratio of the first barrier layer being lower than an In composition ratio of the second well layer; and
forming a first well layer to contact the first barrier layer, an In composition ratio of the first well layer being higher than the In composition ratio of the first barrier layer,
the forming of the first barrier layer including:
forming a first portion to contact the second well layer; and
forming a second portion having a first region and a second region, the first region being in contact with the first portion and having a first In composition ratio higher than an In composition ratio of the first portion, the second region being in contact with the first region and having a second In composition ratio lower than the first In composition ratio.

19. The method according to claim 18, further comprising forming a second barrier layer at a first temperature prior to the forming of the second well layer, an In composition ratio of the second barrier layer being lower than the In composition ratio of the second well layer,
the forming of the second well layer including being performed at a second temperature lower than the first temperature,
the forming of the first barrier layer including forming the first portion and the second portion at the second temperature.

20. The method according to claim 19, wherein
the second temperature is not less than 800° C., and
the difference between the first temperature and the second temperature is less than 100° C. and not less than 20° C.

* * * * *